US012578410B2

(12) United States Patent
Liu et al.

(10) Patent No.: US 12,578,410 B2
(45) Date of Patent: Mar. 17, 2026

(54) METHOD FOR CORRECTING CAPACITANCE MEASUREMENT VALUE UNDER HIGH LEAKAGE CURRENT

(71) Applicant: Shanghai Huali Integrated Circuit Corporation, Shanghai (CN)

(72) Inventors: Xiaoming Liu, Shanghai (CN); Liujiang Yu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 188 days.

(21) Appl. No.: 18/611,150

(22) Filed: Mar. 20, 2024

(65) Prior Publication Data

US 2025/0020751 A1     Jan. 16, 2025

(30) Foreign Application Priority Data

Jul. 11, 2023     (CN) .......................... 202310847952.6

(51) Int. Cl.
| | |
|---|---|
| *G01R 35/00* | (2006.01) |
| *G01R 27/26* | (2006.01) |
| *G06F 17/10* | (2006.01) |

(52) U.S. Cl.
CPC ....... *G01R 35/005* (2013.01); *G01R 27/2605* (2013.01); *G06F 17/10* (2013.01)

(58) Field of Classification Search
CPC ........ G01R 27/00; G01R 27/02; G01R 27/26; G01R 27/2605; G01R 35/00; G01R 35/005; G06F 17/00; G06F 17/10

USPC ................................ 324/600, 649, 658, 686
See application file for complete search history.

(56) References Cited

U.S. PATENT DOCUMENTS

| | | | | | |
|---|---|---|---|---|---|
| 6,456,105 | B1 * | 9/2002 | Tao | .................... | G01R 31/2621 |
| | | | | | 438/16 |
| 6,885,214 | B1 * | 4/2005 | Su | ...................... | G01R 31/2648 |
| | | | | | 324/754.28 |

FOREIGN PATENT DOCUMENTS

| | | | | | |
|---|---|---|---|---|---|
| CN | 104038082 | B | * | 12/2017 | .......... H02M 7/2176 |
| JP | 4667928 | B2 | * | 4/2011 | ......... H03K 19/0185 |

* cited by examiner

*Primary Examiner* — Hoai-An D. Nguyen

(74) *Attorney, Agent, or Firm* — Quarles & Brady LLP

(57) ABSTRACT

The present invention provides a parallel binary model for measuring a capacitance value of a gate oxide layer of a gate oxide MOS device. The parallel binary model is a parallel circuit model formed through parallel connection of a parallel capacitor Cp and an equivalent resistor Rp. The parallel binary model is used to measure the gate oxide MOS device through an LCR meter by adopting frequency f1 to obtain parallel capacitance Cp1 and parallel conductance Gp1. A dissipation factor D1 is calculated. In a case that D1<0.1, the measured parallel capacitance Cp1 is the capacitance value of the gate oxide layer of the gate oxide MOS device. In a case that D1>0.1, the parallel binary model is used to measure the gate oxide MOS device through the LCR meter by adopting frequency f2 to obtain parallel capacitance Cp2 and parallel conductance Gp2.

8 Claims, 3 Drawing Sheets

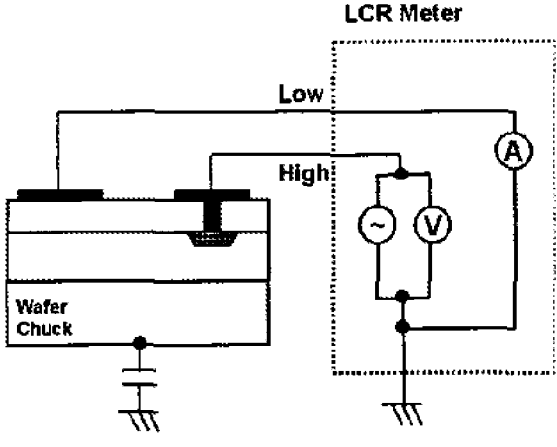
FIG. 1
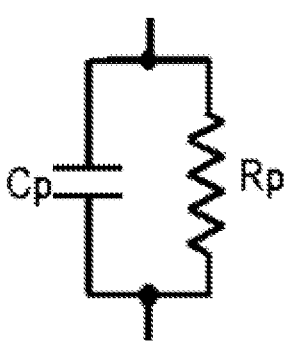
FIG. 2a
FIG. 2b

| Traditional LCR measurement value(unit: farad) | Value obtained in the present invention(unit: farad) | Keysight E4990 10M measurement value(unit: farad) |
|---|---|---|
| 3.28E-11 | 4.58E-11 | 4.49E-11 |

METHOD FOR CORRECTING CAPACITANCE MEASUREMENT VALUE UNDER HIGH LEAKAGE CURRENT

CROSS-REFERENCES TO RELATED APPLICATIONS

This application claims priority to Chinese patent application No. 202310847952.6, filed on Jul. 11, 2023 at CNIPA, and entitled "METHOD FOR CORRECTING CAPACITANCE MEASUREMENT VALUE UNDER HIGH LEAKAGE CURRENT", the disclosure of which is incorporated herein by reference in entirety.

TECHNICAL FIELD

The present invention relates to the technical field of semiconductors, and in particular relates to a method for correcting a capacitance measurement value under high leakage current.

BACKGROUND

LCR (Inductance Capacity Resistance) meter is a measuring instrument used to measure semiconductor inductance, resistance, and electrical parameters of capacitance devices. LCR meter is the most widely used in wafer acceptance tests WAT to measure capacitance parameters, especially the capacitance value of Gate Oxide. During WAT, usually, a high potential end is connected with Bulk and a low potential end is connected with Gate to ensure measurement accuracy and stability. A simplified measurement circuit diagram is as illustrated in FIG. 1.

LCR meter has high measurement accuracy and a wide range of applications. However, in advanced processes such as below 28 nm, the thickness of Gate Oxide becomes increasingly smaller and the leakage current becomes increasingly larger, especially in the accumulation and inversion regions of MOS devices. In a case that the voltage approaches the working voltage VDD (or −VDD), the leakage current at the Gate end increases sharply due to direct tunneling current, and it is common to see a decrease in capacitance measurement value.

This slightly smaller capacitance measurement value is not the true value. It is related to the binary measurement model used by the capacitance measurement instrument. The capacitance measuring instrument typically simplifies capacitance measurement into a parallel model (FIG. 2*a*) and a series model (FIG. 2*b*). These two capacitance models are built in the measurement instrument for users to choose from. The smaller the capacitance measurement value at the wafer level, the more suitable the parallel model. Therefore, traditional wafer level capacitance measurement adopts a parallel binary model illustrated in FIG. 2*a*, which is composed of a parallel circuit formed by a parallel capacitor Cp and an equivalent resistor Rp.

The actual cross-section and equivalent circuit diagram of Gate Oxide are as illustrated in FIG. 3. In addition to the parallel connection of Cp and Rp mentioned above, there is also a series resistor Rs, which is mainly composed of contact resistance and substrate resistance. In traditional processes, since Rp is very large and Rs is very small and much smaller than Rp, it is ignored and the circuit diagram is simplified to the binary parallel model illustrated in FIG. 2*a*. However, since the thickness of Gate Oxide in advanced processes is very small, in a case that the voltage applied to the Gate end increases, the leakage current increases sharply due to direct tunneling current. At this time, the equivalent resistance Rp of the Gate Oxide capacitor decreases sharply, and Rs is no longer much smaller than Rp, making Rs non-ignorable.

The following formula can explain the relationship between the value Cm measured by adopting the binary model and the true value Cp, as well as Rp and Rs:

$$Cm = \frac{Cp}{1 + 2\frac{Rs}{Rp} + (\omega CpRs)^2 + \left(\frac{Rs}{Rp}\right)^2}$$

where $\omega = 2*\pi*f$, f is test frequency. In the traditional processes, Rp is very large, with very small Rs/Rp and (Rs/Rp)^2 in the denominator. After calculation, $(\omega*Cp*Rs)^2$ is also small enough to be ignored, so the measurement value Cm is very close to Cp. In the advanced processes, Rp becomes smaller, and Rs/Rp and (Rs/Rp)^2 become non-ignorable. Therefore, the measurement value Cm is smaller than Cp.

By adopting a higher test frequency, such as 10M or higher, and adopting a more advanced measuring instrument such as Keysight E4990, reasonable capacitance values for thin Gate Oxides under advanced processes can also be obtained. But it will also bring new problems: 1) these instruments are not commonly used WAT (Wafer Acceptable Test) measuring instruments, are low in automation and are not suitable for batch measurement; 2) measurement at higher frequencies is usually more sensitive to device structure and parasitic circuits of measuring instruments; inappropriate layout (circuit design) and hardware environment make it difficult to obtain reasonable results, making it unsuitable for wafer mass production and testing environments.

BRIEF SUMMARY

In view of the disadvantages of the existing technologies mentioned above, the purpose of the present invention is to provide a method for correcting a capacitance measurement value under high leakage current, which is used to solve the problems that the traditional binary model of the LCR meter fails and the capacitance value is lower than the true value due to high leakage current in the existing technologies.

In order to achieve the above purpose and other related purposes, the present invention provides a method for correcting a capacitance measurement value under high leakage current, at least including:

step 1: providing a parallel binary model for measuring a capacitance value of a gate oxide layer of a gate oxide MOS device, the parallel binary model being a parallel circuit model formed through parallel connection of a parallel capacitor Cp and an equivalent resistor Rp;

step 2: using the parallel binary model to measure the gate oxide MOS device through an LCR meter by adopting frequency f1 to obtain parallel capacitance Cp1 and parallel conductance Gp1; and calculating a dissipation factor D1=Gp1/(ω*Cp1), where ω=2*π*f1; in a case that D1<0.1, the measured parallel capacitance Cp1 is the capacitance value of the gate oxide layer of the gate oxide MOS device; and in case that D1>0.1, step 3 is performed;

step 3: using the parallel binary model to measure the gate oxide MOS device through the LCR meter by adopting frequency f2 to obtain parallel capacitance Cp2 and parallel conductance Gp2; and step 4: giving formula 1:

$$Cp = \frac{C}{(1 + rs*G)^2 + (\omega*rs*C)^2}$$

and formula 2:

$$Gp = \frac{G(1 + rs*G) + rs*(\omega C)^2}{(1 + rs*G)^2 + (\omega*rs*C)^2},$$

where rs is a resistance value of a series resistor; substituting Cp1, Gp1, Cp2 and Gp2 into formula 1 and formula 2 to obtain an actual capacitance value C of the gate oxide layer of the gate oxide MOS device.

Exemplarily, in step 2, the gate oxide MOS device is measured by adopting frequency f1, and the obtained parallel capacitance Cp1 is a capacitance value continuously changing with voltage.

Exemplarily, in step 2, in a case that the dissipation factor D1>0.1, the parallel capacitance Cp1 is a capacitance value that is not accurately measured under large leakage current.

Exemplarily, in step 2, in a case that the dissipation factor D1>0.1, the parallel capacitance Cp1 has a trend of increasing and then decreasing with continuous increase of voltage.

Exemplarily, in step 2, in a case that the dissipation factor D1>0.1 and the voltage is greater than 1V, the parallel capacitance Cp1 decreases sharply.

Exemplarily, in step 3, the frequency f2 is a frequency point of the LCR meter after frequency calibration.

Exemplarily, in step 3, a method of selecting the frequency f2 includes: respectively providing three frequency values f that are different from the frequency f1, and respectively calculating corresponding three dissipation factors D2=Gp2/(ω*Cp2), where ω=2*π*f, and using the frequency value corresponding to the smallest D2 as the frequency f2.

Exemplarily, in step 4, rs is composed of contact resistance and substrate resistance in the gate oxide MOS device.

As mentioned above, the method for correcting the capacitance measurement value under high leakage current provided by the present invention has the following beneficial effects: the present invention uses a capacitance ternary model calculation formula, uses a conventional LCR meter to measure at two frequencies, and calculates to obtain a capacitance value closer to the true capacitance value of the gate oxide layer. The capacitance value measured under high leakage current is corrected. The corrected capacitance value is more in line with the physical characteristics of the device and is a more reasonable value.

BRIEF DESCRIPTION OF THE DRAWINGS

FIG. 1 illustrates a schematic diagram of simplified measurement of capacitance of a gate oxide layer of a gate oxide MOS device in an existing technology.

FIG. 2a illustrates a schematic diagram of a binary parallel measurement model of capacitance in an existing technology.

FIG. 2b illustrates a schematic diagram of a binary series measurement model of capacitance in an existing technology.

4

Figure 3:
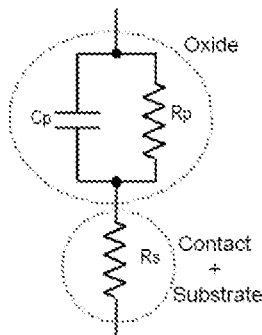

FIG. 3 illustrates a schematic diagram of a ternary measurement model of capacitance in an existing technology.

Figure 4:
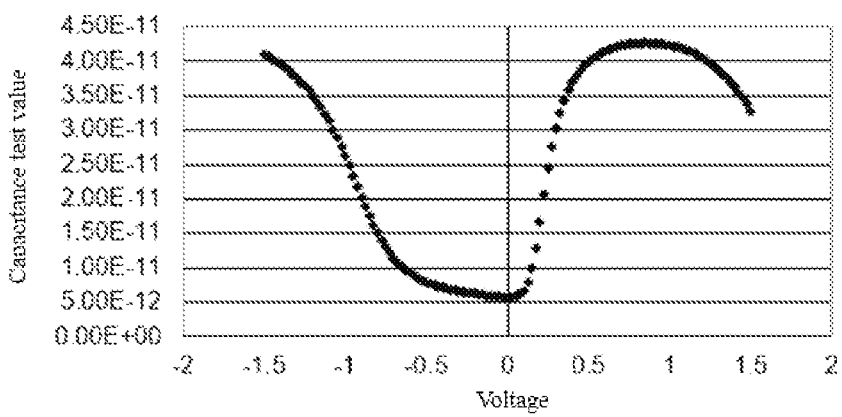

FIG. 4 illustrates a change curve of capacitance values measured by adopting a parallel binary model in an LCR meter as a function of voltage in the present invention.

Figure 5:
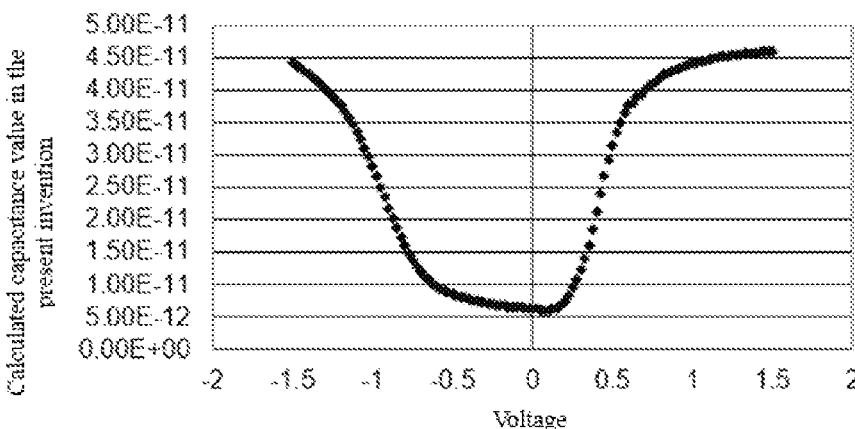

FIG. 5 illustrates a change curve of capacitance values obtained after calculation in step 4 as a function of voltage in the present invention.

FIG. 6 illustrates a comparison between a traditional LCR capacitance measurement value, a capacitance measurement value in the present invention, and a capacitance measurement value measured by adopting Keysight E4990.

DETAILED DESCRIPTION OF THE DISCLOSURE

The embodiments of the present invention will be specifically described below through specific examples. Those skilled in the art can easily understand the other advantages and effects of the present invention from the content disclosed in this description. The present invention may also be implemented or applied through other different specific embodiments, and the details in this description may be modified or changed based on different perspectives and applications without deviating from the spirit of the present invention.

Please refer to FIG. 1 to FIG. 6. It should be noted that the drawings provided in the embodiments are only intended to schematically describe the basic concept of the present invention. Therefore, the drawings only display the components related to the present invention, and are not drawn according to the actual number, shape, and size of the components during actual implementation. The type, number, and scale of each component during actual implementation may be freely changed, and the layout of the component may also be more complex.

The present invention provides a method for correcting a capacitance measurement value under high leakage current, which at least includes the following steps:

In step 1, a parallel binary model for measuring a capacitance value of a gate oxide layer of a gate oxide MOS device is provided. The parallel binary model is a parallel circuit model formed through parallel connection of a parallel capacitor Cp and an equivalent resistor Rp, i.e., a parallel circuit model in FIG. 2a.

In step 2, the parallel binary model is used to measure the gate oxide MOS device through an LCR meter by adopting frequency f1 to obtain parallel capacitance Cp1 and parallel conductance Gp1; and a dissipation factor D1=Gp1/(ω*Cp1) is calculated, where ω=2*π*f1; in a case that D1<0.1, the measured parallel capacitance Cp1 is the capacitance value of the gate oxide layer of the gate oxide MOS device; and in case that D1>0.1, step 3 is performed.

The capacitance models of the parallel binary model are built in the measurement instrument for users to choose from. In step 2, the capacitance of the gate oxide layer of the gate oxide MOS device is measured by adopting frequency f1 to obtain parallel capacitance Cp1 and parallel conductance Gp1.

Further, in the present invention, in step 2 of this embodiment, the gate oxide MOS device is measured by adopting frequency f1, and the obtained parallel capacitance Cp1 is a capacitance value continuously changing with voltage.

Further, in the present invention, in step 2 of this embodiment, in a case that the dissipation factor D1>0.1, the parallel capacitance Cp1 is a capacitance value that is not accurately measured under large leakage current. Further, in the present invention, in step 2 of this embodiment, in a case that the dissipation factor D1>0.1, the parallel capacitance Cp1 has a trend of increasing and then decreasing with continuous increase of voltage. Refer to FIG. 4. FIG. 4 illustrates a change curve of capacitance values measured by adopting a parallel binary model in an LCR meter as a function of voltage in the present invention.

Further, in the present invention, in step 2 of this embodiment, in a case that the dissipation factor D1>0.1 and the voltage is greater than 1V, the parallel capacitance Cp1 decreases sharply. Referring to FIG. 4, it can be seen that in a case that the voltage is close to and greater than 1V, the capacitance value decreases sharply. Step 2 requires observing whether the capacitance measurement value is normal. In a case that there is a phenomenon of "falling" of capacitance under high voltage, there is capacitance "that is not accurately measured" under large leakage current. The dissipation factor D1=Gp1/(ω*Cp1) is calculated, where ω=2*π*f, where π=3.1415926. The larger D, the more severe the leakage of the device; in a case that D>0.1, the device meets the characteristics of capacitance under large leakage current.

In step 3, the parallel binary model is used to measure the gate oxide MOS device through the LCR meter by adopting frequency f2 to obtain parallel capacitance Cp2 and parallel conductance Gp2.

Further, in the present invention, in step 3 of this embodiment, the frequency f2 is a frequency point of the LCR tester after frequency calibration. The frequency f2 in this step is a different frequency from the frequency f1 in step 2.

Further, in the present invention, in step 3 of this embodiment, a method of selecting the frequency f2 includes: respectively providing three frequency values f that are different from the frequency f1, and respectively calculating corresponding three dissipation factors D2=Gp2/(ω*Cp2), where ω=2*π*f, and using the frequency value corresponding to the smallest D2 as the frequency f2. Therefore, the selection of the frequency f2 in this step is based on the calculated value of the dissipation factor D2, and the frequency point corresponding to small D2 is selected as much as possible.

In step 4, formula 1:

$$Cp = \frac{C}{(1 + rs * G)^2 + (\omega * rs * C)^2}$$

and formula 2:

$$Gp = \frac{G(1 + rs * G) + rs * (\omega C)^2}{(1 + rs * G)^2 + (\omega * rs * C)^2}$$

given, where rs is a resistance value of a series resistor; Cp1, Gp1, Cp2 and Gp2 are substituted into formula 1 and formula 2 to obtain an actual capacitance value C of the gate oxide layer of the gate oxide MOS device.

Further, in the present invention, in step 4 of this embodiment, Rs is composed of contact resistance and substrate resistance in the gate oxide MOS device.

The present invention introduces a more accurate ternary capacitance model through a conventional LCR meter. By measuring capacitance at two frequencies, an accurate capacitance value can be calculated. According to the principle of impedance measurement, if the binary capacitance model in FIG. 2*a* is adopted, the impedance measured by the LCR meter is Y(b)=Gp+jωCp; if the ternary capacitance model in FIG. 3 is adopted, the actual measured impedance is $$Y(a) = \frac{G + rsG^2 + rs(\omega C)^2}{(1 + rsG)^2 + (\omega rsC)^2} + \frac{j\omega C}{(1 + rsG)^2 + (\omega rsC)^2},$$

where C and G are true values of capacitance and conductance, and rs is composed of contact resistance and substrate resistance in the gate oxygen MOS device. The relationship between the measurement values Cp and Gp and the true values C and G can be obtained as follows:

$$Cp = \frac{C}{(1 + rsG)^2 + (\omega rsC)^2}; Gp = \frac{G(1 + rsG) + rs(\omega C)^2}{(1 + rsG)^2 + (\omega rsC)^2}.$$

In the above relationship, in addition to C and G being the values that the present invention aims to calculate, the series resistance Rs is unknown, so there are three unknown parameters. In the process of using the LCR meter to measure capacitance, the values of Cp1 and Gp1 can be simultaneously measured by adopting a frequency, such as f1, obtaining two equations, which is insufficient to obtain the values of C, G, and Rs. If an additional reference frequency point f2 is added, the values of Cp2 and Gp2 can be measured, obtaining four equations, and then the values of C and P can be calculated.

Refer to FIG. 5. FIG. 5 illustrates a change curve of capacitance values obtained after calculation in step 4 as a function of voltage in the present invention.

Adopting a higher measurement frequency and more accurate measuring instrument is also a way to solve the problem that Gate Oxide capacitance falls off under advanced processes. In order to verify the effectiveness of the present invention, Keysight E4990 is adopted to perform comparative verification on the data point in FIG. 4 which falls off the most severely (at voltage of 1.5V). Refer to FIG. 6. FIG. 6 illustrates a comparison between a traditional LCR capacitance measurement value, a capacitance measurement value in the present invention, and a capacitance measurement value measured by adopting Keysight E4990. The data in FIG. 6 proves that the capacitance value calculated in the present invention is closer to the measurement result obtained by adopting Keysight E4990 than the initial test value. Therefore, the present invention can obtain a method for measuring capacitance under large leakage current applicable to the advanced processes by using a commonly used LCR meter.

To sum up, the present invention uses a capacitance ternary model calculation formula, uses a conventional LCR meter to measure at two frequencies, and calculates to obtain a capacitance value closer to the true capacitance value of the gate oxide layer. The capacitance value measured under high leakage current is corrected. The corrected capacitance value is more in line with the physical characteristics of the device and is a more reasonable value. Therefore, the present invention effectively overcomes various disadvantages in the existing technologies and has a great industrial utilization value.

The above embodiments are only intended to exemplarily describe the principle and effect of the present invention, rather than to limit the present invention. Those skilled in the art may modify or change the embodiments without departing from the spirit and scope of the present invention.

Therefore, all equivalent modifications or changes completed by those with ordinary knowledge in the technical field without departing from the spirit and technical concept disclosed in the present invention should still be covered by the claims of the present invention.

What is claimed is:

1. A method for correcting a capacitance measurement value under high leakage current, at least comprising:

step 1: providing a parallel binary model for measuring a capacitance value of a gate oxide layer of a gate oxide MOS device, the parallel binary model being a parallel circuit model formed through parallel connection of a parallel capacitor Cp and an equivalent resistor Rp;

step 2: using the parallel binary model to measure the gate oxide MOS device through an LCR meter by adopting frequency f1 to obtain parallel capacitance Cp1 and parallel conductance Gp1; and calculating a dissipation factor D1=Gp1/($\omega$*Cp1), where $\omega$=2*71*f1; in a case that D1<0.1, the measured parallel capacitance Cp1 is the capacitance value of the gate oxide layer of the gate oxide MOS device; and in case that D1>0.1, step 3 is performed;

step 3: using the parallel binary model to measure the gate oxide MOS device through the LCR meter by adopting frequency f2 to obtain parallel capacitance Cp2 and parallel conductance Gp2; and step 4: giving formula 1:

$$Cp = \frac{C}{(1 + rs * G)^2 + (\omega * rs * C)^2}$$

and formula 2:

$$Gp = \frac{G(1 + rs * G) + rs * (\omega C)^2}{(1 + rs * G)^2 + (\omega * rs * C)^2},$$

where rs is a resistance value of a series resistor; substituting Cp1, Gp1, Cp2 and Gp2 into formula 1 and formula 2 to obtain an actual capacitance value C of the gate oxide layer of the gate oxide MOS device.

2. The method for correcting the capacitance measurement value under high leakage current according to claim 1, wherein in step 2, the gate oxide MOS device is measured by adopting frequency f1, and the obtained parallel capacitance Cp1 is a capacitance value continuously changing with voltage.

3. The method for correcting the capacitance measurement value under high leakage current according to claim 2, wherein in step 2, in a case that the dissipation factor D1>0.1, the parallel capacitance Cp1 is a capacitance value that is not accurately measured under large leakage current.

4. The method for correcting the capacitance measurement value under high leakage current according to claim 3, wherein in step 2, in a case that the dissipation factor D1>0.1, the parallel capacitance Cp1 has a trend of increasing and then decreasing with continuous increase of voltage.

5. The method for correcting the capacitance measurement value under high leakage current according to claim 4, wherein in step 2, in a case that the dissipation factor D1>0.1 and the voltage is greater than 1V, the parallel capacitance Cp1 decreases sharply.

6. The method for correcting the capacitance measurement value under high leakage current according to claim 1, wherein in step 3, the frequency f2 is a frequency point of the LCR meter after frequency calibration.

7. The method for correcting the capacitance measurement value under high leakage current according to claim 1, wherein in step 3, a method of selecting the frequency f2 comprises: respectively providing three frequency values f that are different from the frequency f1, and respectively calculating corresponding three dissipation factors D2=Gp2/($\omega$*Cp2), where $\omega$=2*$\pi$*f, and using the frequency value corresponding to the smallest D2 as the frequency f2.

8. The method for correcting the capacitance measurement value under high leakage current according to claim 1, wherein in step 4, rs is composed of contact resistance and substrate resistance in the gate oxide MOS device.

* * * * *